(12) United States Patent
Wang et al.

(10) Patent No.: US 10,263,619 B1
(45) Date of Patent: Apr. 16, 2019

(54) LOW LEAKAGE ISOLATION CELL

(71) Applicant: NXP USA, INC., Austin, TX (US)

(72) Inventors: Peidong Wang, Suzhou (CN); Miaolin Tan, Suzhou (CN); Zhe Ge, Suzhou (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/922,901

(22) Filed: Mar. 15, 2018

(30) Foreign Application Priority Data

Nov. 9, 2017 (CN) .......................... 2017 1 1101171

(51) Int. Cl.
*H03K 19/00* (2006.01)
*G06F 1/3287* (2019.01)

(52) U.S. Cl.
CPC ....... *H03K 19/0016* (2013.01); *G06F 1/3287* (2013.01)

(58) Field of Classification Search
None
See application file for complete search history.

(56) References Cited

U.S. PATENT DOCUMENTS

| | | | |
|---|---|---|---|
| 6,677,797 B2* | 1/2004 | Kameyama | H03K 19/0016 326/80 |
| 6,806,757 B2* | 10/2004 | Mukai | H03K 19/018507 326/81 |
| 7,167,017 B2 | 1/2007 | Arora et al. | |
| 7,982,498 B1 | 7/2011 | Chen | |
| 8,020,017 B2 | 9/2011 | Padhye et al. | |
| 8,456,217 B2 | 6/2013 | Goldstein et al. | |
| 8,598,936 B2* | 12/2013 | Kuge | H03K 19/00369 326/52 |
| 9,030,249 B2* | 5/2015 | Takada | H03L 5/02 326/80 |
| 9,374,089 B2 | 6/2016 | Huang et al. | |
| 9,407,264 B1 | 8/2016 | Ali et al. | |

* cited by examiner

*Primary Examiner* — Minh D A
*Assistant Examiner* — James H Cho
(74) *Attorney, Agent, or Firm* — Charles E. Bergere

(57) ABSTRACT

An isolation cell clamps a signal passing from a first, powered-down power domain to a second, power-on power domain. To reduce leakage current, some of the circuits and devices are connected to a voltage supply of the first or "from" power domain, while other circuits and devices are connected to a voltage supply of the second or "to" power domain.

11 Claims, 4 Drawing Sheets

LOW LEAKAGE ISOLATION CELL

BACKGROUND

The present invention generally relates to an isolation cell and method for isolating output signals and, more particularly, to a low leakage isolation cell.

Isolation cells are used to isolate output signals of a powered down domain. Output signals of a powered down domain may have an intermediate voltage level, so isolation cells are used to clamp the signals to a specific voltage level before passing them to another voltage domain. FIG. 1 shows a circuit diagram of a conventional isolation cell 10. The isolation cell 10 includes a first inverter 12, a logic circuit 14, and a second inverter 16. The first inverter 12 receives an isolation control signal "iso" and generates an inverted version "isob" of the signal "iso". The logic circuit 14, which is a NAND gate, receives an input signal "a" from a first power domain and the inverted solation control signal isob, and provides a logic output signal "sn1". The second inverter 16 is connected to the logic circuit 14 to receive the logic output signal "sn1", and generates an inverted version "x" of the output signal "sn1", which may be provided to a second power domain.

From the circuit diagram of FIG. 1, a logic expression of the isolation cell 10 is: $x=\overline{iso}\cdot a$, and a truth table of the isolation cell 10 is:

| Iso | A | X |
|-----|---|---|
| 0   | 0 | 0 |
| 0   | 1 | 1 |
| 1   | 0 | 0 |
| 1   | 1 | 0 |

For normal operations, the first and second inverters 12 and 16, and the logic circuit 14 must be powered by the power of the second power domain (the "to" power domain), so that when the first power domain (the "from" power domain) is powered down, the isolation cell 10 can still operate normally.

Low leakage in stop or power down mode is a key feature of integrated circuits, and low leakage is desirable to improve battery life in portable devices. However, since the when the PMOS transistors of the first inverter 12, the logic gate 14 and the second inverter 14 are connected to the voltage supply of the second power domain (i.e., Vddc), the isolation cell 10 suffers from considerable leakage current.

It would be advantageous to have a low leakage isolation cell.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides an isolation cell connected between first and second circuit modules, where the first and second circuit modules comprise different power domains. The isolation cell comprises an input terminal configured to receive an input signal from the first circuit module, an output terminal configured to provide an output signal to the second circuit module, and a control terminal configured to receive a control signal. The isolation cell generates the output signal from the input signal in response to the control signal. A first power terminal is coupled with a first voltage supply of the first circuit module, and a second power terminal is coupled with a second voltage supply of the second circuit module.

In another embodiment, the present invention provides a method of clamping an input signal going from a first power domain to a second power domain, where the first power domain operates at a first supply voltage and the second power domain operates at a second supply voltage different from the first supply voltage. The method comprises: receiving, at an input terminal, the input signal from the first power domain; receiving, at a control terminal, a control signal; providing at least one logic gate that receives the input signal and the control signal and generates a logic signal in response to the control signal and the input signal; providing an output inverter that has an input terminal that receives the logic signal and an output terminal that provides an output signal; and configuring the at least one logic gate and the output inverter such that one of the at least one logic gate and the output inverter is coupled with the first supply voltage, and the other of the at least one logic gate and the output inverter is coupled with the second supply voltage.

In yet another embodiment, the present invention provides an isolation cell coupled between a first circuit module and a second circuit module, where the first and second circuit modules comprise different power domains. The isolation cell comprises a logic circuit having an input terminal for receiving an input signal from the first circuit module and a control terminal for receiving a control signal. The logic circuit provides a logic signal in response to the control signal. The isolation cell also comprises an output circuit coupled with the logic circuit to receive the logic signal. The output circuit provides an output signal to the second circuit module. One of the logic circuit and the output circuit is coupled with a voltage supply of one of the first and the second circuit modules, and the other one of the logic circuit and the output circuit is coupled with a voltage supply of the other one of the first and second circuit modules.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
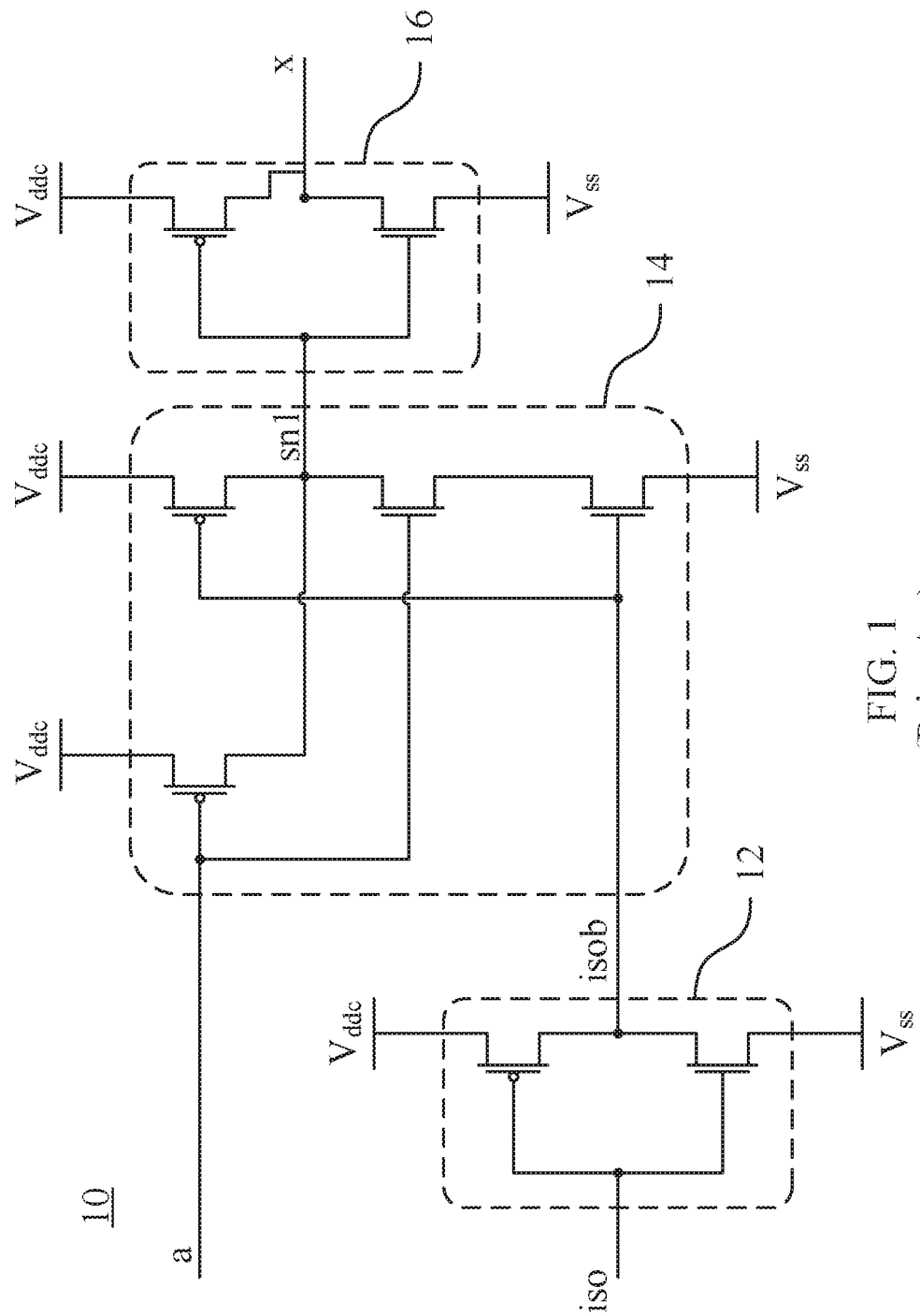
FIG. 1 is a circuit diagram of a conventional isolation cell.
Figure 2:
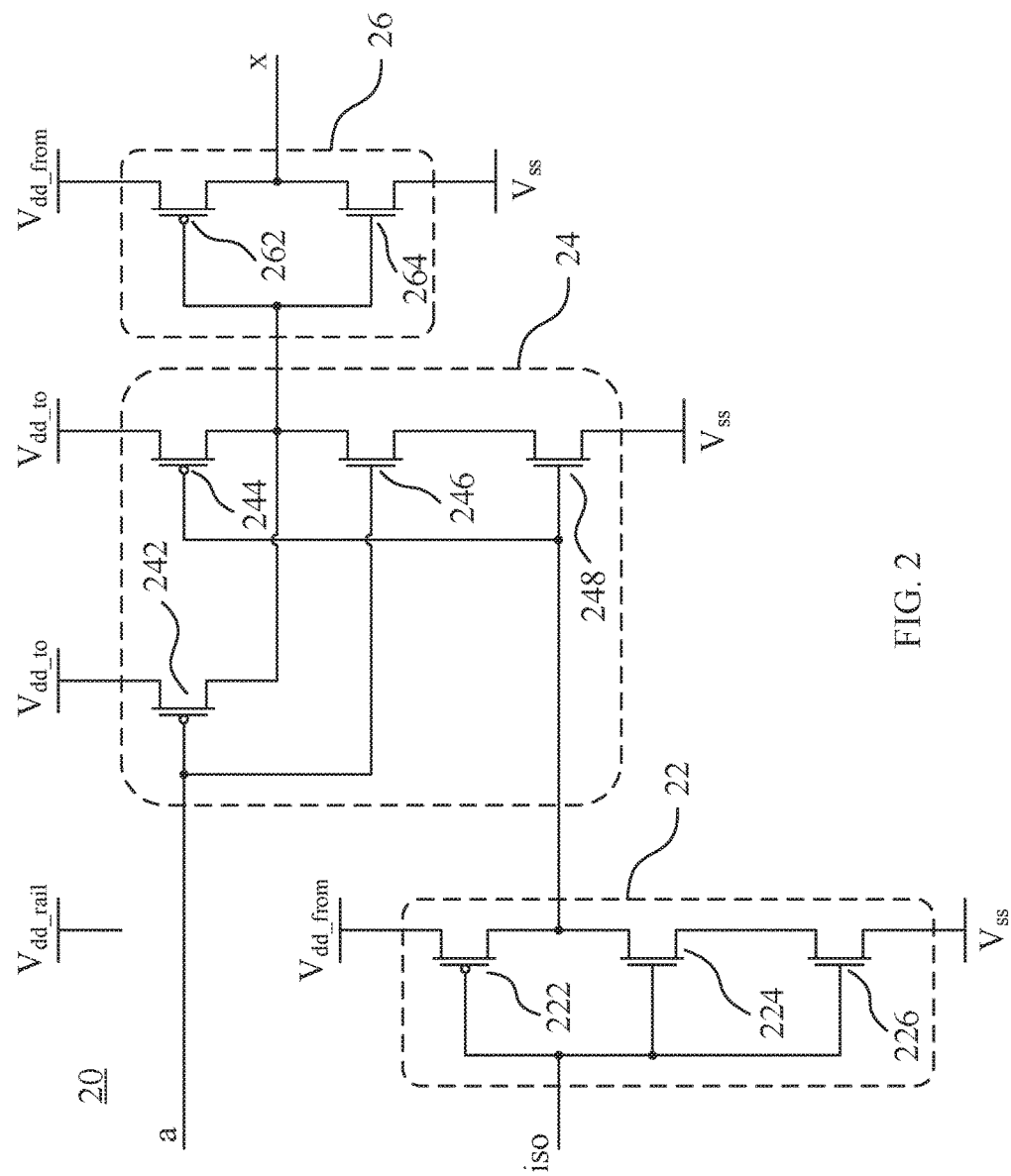
FIG. 2 is a circuit diagram of an isolation cell in accordance with a first embodiment of the present invention.

FIG. 2 is an isolation cell according to a first exemplary embodiment of the present invention. Similar to the structure of the isolation cell 10 of FIG. 1, the isolation cell 20 includes a first inverter 22, a logic circuit 24, and a second inverter 26. The first inverter 22 receives the isolation control signal "iso" and provide an inverted signal thereof to the logic circuit 24. The first inverter 22 is also referred to as an input inverter. The logic circuit 24 receives the input signal "a" from the first or "from" power domain, and provides a logic output signal to the second inverter 26. The second inverter 26 then provides an output signal "x" as the output of the isolation cell 20. The second inverter 26 is also referred to as an output inverter.

The input inverter 22 comprises a first PMOS transistor 222, a first NMOS transistor 224, and a second NMOS transistor 226, all connected in series between a first voltage Vdd_from, which is a voltage supply of the first or from power domain, and ground (Vss), and the gates of the transistors 222, 224 and 226 all receive the isolation control signal iso. The output of the input inverter 22 is provided at a node between the drains of the first PMOS transistor 222 and the first NMOS transistor 224. It should be noted that the conventional isolation cell 10 does not include the second NMOS transistor 226, and that the inverter 12 is connected to the voltage supply of the "to" power domain.

If the isolation control signal "iso" is logic "1", the first PMOS transistor 222 is off, such that the output of the first inverter 22 is logic "0". The additional NMOS transistor 226 does not impact the switching of the first inverter 22. If the isolation control signal "iso" is logic "0", the first PMOS transistor 222 is on, while the first NMOS transistor 224 and the additional NMOS transistor 226 are off, such that the leakage of the first PMOS transistor 222 is cut-off. The additional NMOS transistor 226 reduces or eliminates the leakage of the first inverter 22.

If the isolation cell 20 is provided as an operational or functional cell, the first power terminal Vdd_from is coupled with the voltage supply of the first power domain, and if the isolation cell 20 is provided as a spare cell, the first power terminal Vdd_from is floating and configured to be coupled with the voltage supply of the first power domain.

The logic circuit 24 is a NAND gate that is similar to the logic circuit 14 of FIG. 1, and comprises second and third PMOS transistors 242 and 244, and third and fourth NMOS transistors 246 and 248. Source terminals of the second and third PMOS transistors 242 and 244 are coupled to a second power terminals Vdd_to. The second power terminal Vdd_to is coupled with a voltage supply (Vdd_to) of the second or "to" power domain. If the isolation cell 20 is provided as a functional cell, the second power terminal Vdd_to is coupled with the power of the second signal module, and if the isolation cell 20 is provided as a spare cell, the second power terminal Vdd_to is floating and configured to be coupled with the voltage supply of the second power domain.

The second inverter 26 is similar to the second inverter 16 of FIG. 1, and comprises a fourth PMOS transistor 262 and a fifth NMOS transistor 264. A source terminal of the fourth PMOS transistor 262 is coupled with the voltage supply of the first power domain Vdd_from. If the isolation cell 20 is provided as a functional cell, the first power terminal Vdd_from is coupled with the voltage supply of the first power domain, and if the isolation cell 20 is provided as a spare cell, the first power terminal Vdd_from is floating and configured to be coupled with the voltage supply of the first power domain.

FIG. 2 also shows a power terminal Vdd_rail, which is the voltage of the signal module depending on the "location" of the isolation cell 20. The described "location" does not necessarily mean the physical location of the isolation cell 20, but is applicable to electrical connections of the isolation cell 20. For example, if the isolation cell 20 is located in (or connected in) the first power domain, the first power terminals Vdd_from are coupled to or couplable with the power terminal Vdd_rail, while on the other hand, if the isolation cell 20 is located in (or connected in) the second power domain, the second power terminals Vdd_to are coupled to or couplable with the power terminal Vdd_rail.

The truth table of the isolation cell 20 is the same as that of the isolation cell 10 of FIG. 1. The isolation cell 20 provides at its output terminal the output signal "x" at logic zero, in response to the isolation control signal "iso" being logic "1". Further, if the isolation control signal "iso" is logic "1", the first PMOS transistor 222 of the first inverter 22 and the fourth PMOS transistor 262 of the second inverter 26 are off. Because in the isolation mode the voltage supply of the first power domain is off (powered down), no leakage occurs in either the first inverter 22 or the second inverter 26, meaning that at least 50% of the leakage is saved when compared to the isolation cell 10 of FIG. 1. Further, since the PMOS transistors of the isolation cell 20 are couplable with the voltage supplies of the first and/or second power domains, the isolation cell 20 enjoys more "location" flexibility for physical layout.

Figure 3:
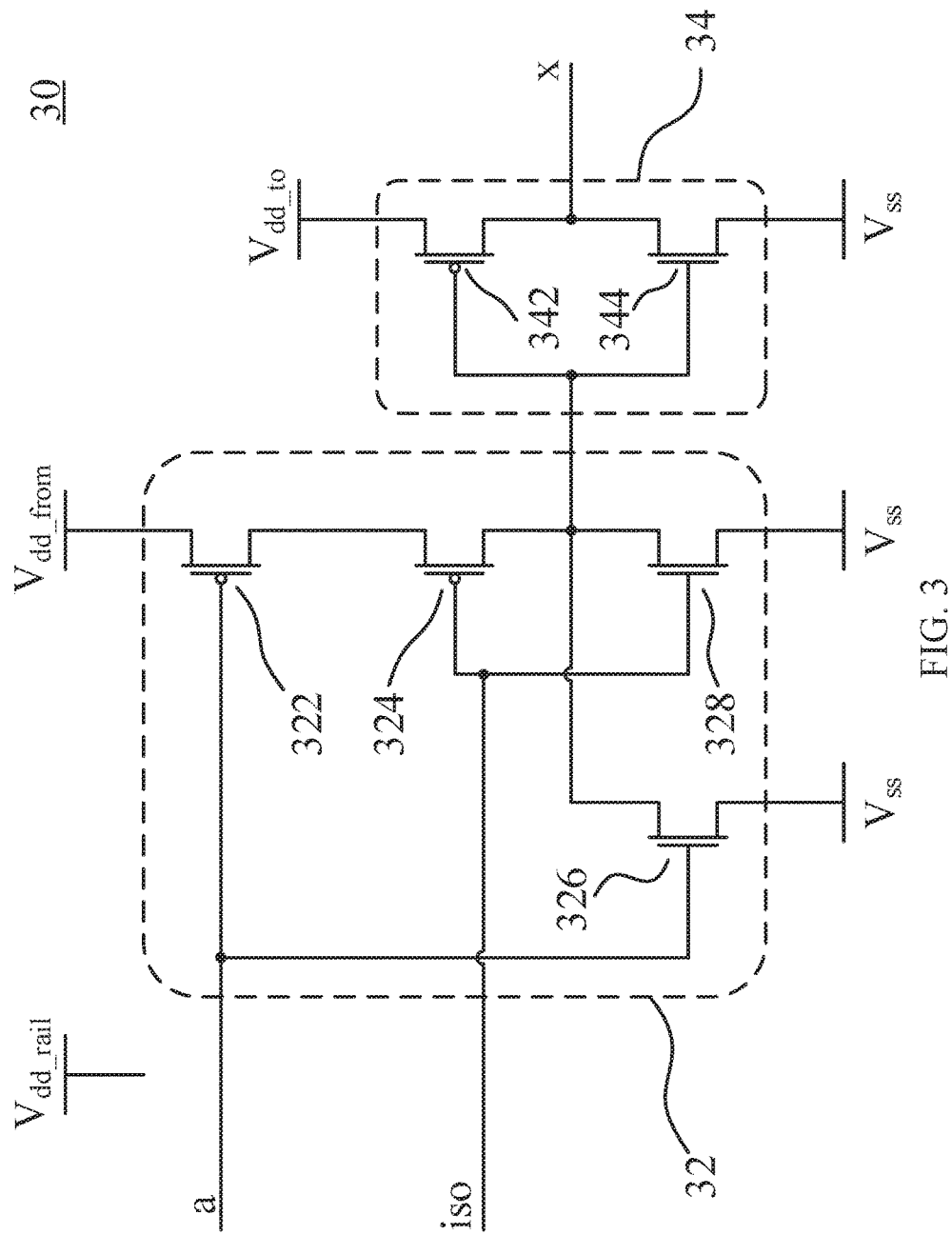
FIG. 3 is a circuit diagram of an isolation cell in accordance with a second embodiment of the present invention.

FIG. 3 shows another embodiment of an isolation cell 20. The isolation cell 30 includes a logic circuit 32 and an inverter 34. The logic circuit 32 implements a NOR gate, and receives the input signal "a" and the isolation control signal "iso". The inverter 34 is coupled with an output of the logic circuit 32 to receive a logic signal provided by the logic circuit 32. The inverter 34 provides an inverted version of the logic signal as the output signal "x" of the isolation cell 30.

The logic circuit 32 includes a first PMOS transistor 322, a second PMOS transistor 324, a first NMOS transistor 326, and a second NMOS transistor 328. Gate terminals of the first PMOS transistor 322 and the first NMOS transistor 326 are coupled to receive the input signal "a". A source terminal of the first PMOS transistor 322 is coupled with a first power terminal Vdd_from, and a drain terminal of the first PMOS transistor 322 is coupled with a source terminal of the second PMOS transistor 324. Gate terminals of the second PMOS transistor 324 and the second NMOS transistor 328 are coupled to receive the isolation control signal "iso". Drain terminals of the second PMOS transistor 324 and the second NMOS transistor 328 are coupled together to provide an output logic signal of the logic circuit 32. Source terminals of the first NMOS transistor 326 and the second NMOS transistor 328 are coupled to another voltage supply Vss (ground).

The output inverter 34 is similar to the output inverter 16 of FIG. 1 and the output inverter 26 of FIG. 2. The output inverter 34 receives the logic signal provided by the logic circuit 32 and provides an inverted version thereof, which is output as the output signal "x" of the isolation cell 30. The output inverter 26 comprises a third PMOS transistor 342 coupled to the second power terminal Vdd_to, and a third NMOS transistor 344 coupled to ground (Vss).

From the circuit diagram of FIG. 3, a logic expression of the isolation cell 30 is: x=$\overline{\overline{a+iso}}$=a+iso, and a truth table of the isolation cell 30 is:

| iso | A | x |
|---|---|---|
| 0 | 0 | 0 |
| 0 | 1 | 1 |
| 1 | 0 | 1 |
| 1 | 1 | 1 |

Similar to the power terminal Vdd_rail in FIG. 2, a power terminal Vdd_rail provides the voltage of the first power domain if the isolation cell 30 is located in the first power domain, or provides the voltage of the second power domain if the isolation cell 30 is located in the second power domain. The logic circuit 32 and the output inverter 34 are coupled to different voltage supplies, such that when the isolation control signal "iso" is logic high to switch off the second PMOS transistor 324, there is no leakage in the logic circuit 32 because the voltage Vdd_from coupled thereto is from the powered-down power domain. Further, like the isolation cell 20 of FIG. 2, the couplability of the first and second power terminals enables the isolation cell 30 to be flexible in its placement, which means the isolation cell 30 can be either placed in the first power domain or in the second power domain.

Figure 4:
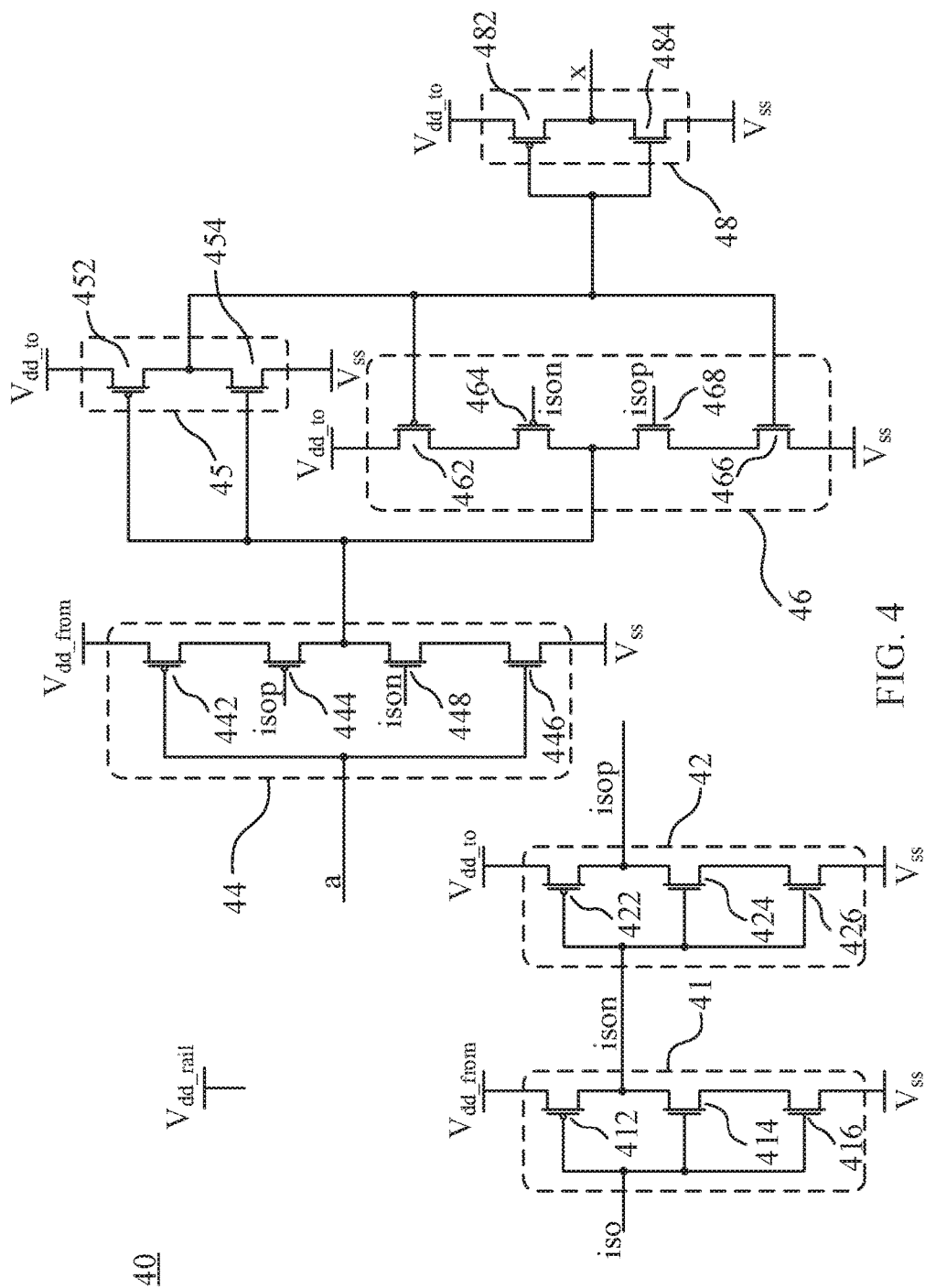
FIG. 4 is a circuit diagram of an isolation cell according to a third embodiment of the present invention.

FIG. 4 shows an isolation cell 40 according to still another embodiment of the present invention. The isolation cell 40 includes a first input inverter 41, a second input inverter 42, a three-state gate 44, a first latch inverter 45, a second latch inverter 46, and an output inverter 48.

The first input inverter 41 is similar to the first inverter 22 of FIG. 2, and includes a first PMOS transistor 412, a first NMOS transistor 414, and a second or additional NMOS transistor 416. The first input inverter 41 receives the isolation control signal "iso" and provides an inverted version "ison" of the isolation control signal "iso" at a node between drain terminals of the first PMOS transistor 412 and the first NMOS transistor 414. The first input inverter 41 is coupled between the first power terminal Vdd_from to be coupled with the voltage supply of the first power domain (Vdd_from) and ground (Vss).

The second input inverter 42 is coupled with the first input inverter 41 to receive the output signal "ison" from the first input inverter 41. The second input inverter 42 is similar to the first input inverter 41 and includes a second PMOS transistor 422, a second NMOS transistor 424, and an additional, third NMOS transistor 426. The second input inverter 42 provides an inverted version "isop" of the output signal "ison" of the first input inverter 41. The second input inverter 42 is coupled to the second power terminal $V_{dd\_to}$ to be coupled to the voltage supply of the second power domain (vdd_to).

The three-state gate 44 includes four series connected transistors, namely a third PMOS transistor 442, a fourth PMOS transistor 444, a fifth NMOS transistor 446, and a sixth NMOS transistor 448. A source terminal of the third PMOS transistor 442 is coupled with the first power terminal to be coupled with the voltage supply (Vdd_from) of the first power domain. A gate terminal of the third PMOS transistor 442 is coupled to receive the input signal "a". A drain terminal of the third PMOS transistor 442 is coupled with a source terminal of the fourth PMOS transistor 444. A gate terminal of the fourth PMOS transistor 444 is coupled to receive the output signal "isop" of the second input inverter 42. A drain terminal of the fourth PMOS transistor 444 is coupled with a drain terminal of the sixth NMOS transistor 448. A source terminal of the sixth NMOS transistor 448 is coupled with a drain terminal of the fifth NMOS transistor 446. A gate terminal of the sixth NMOS transistor 448 is coupled to receive the output signal "ison" of the first input inverter 41. A source terminal of the fifth NMOS transistor 446 is coupled with ground (Vss). A gate terminal of the fifth NMOS transistor 446 is coupled with the gate terminal of the third PMOS transistor 442 to receive the input signal "a". A node between the drain terminals of the fourth PMOS transistor 444 and the sixth NMOS transistor 448 provides an output signal of the three-state gate 44.

The first latch inverter 45 is similar to the output inverters 16, 26, and 34 of FIGS. 1, 2, and 3. The first latch inverter 45 includes a fifth PMOS transistor 452, which is coupled with the second power terminal Vdd_to and a seventh NMOS transistor 454. A node between the drain terminals of the fifth PMOS transistor 452 and the seventh NMOS transistor 454 provides an output signal of the first latch inverter 45.

The second latch inverter 46 is similar to the three-state gate 44, and includes series connected transistors, namely a sixth PMOS transistor 462, a seventh PMOS transistor 464, an eighth NMOS transistor 466, and a ninth NMOS transistor 468. A gate terminal of the seventh PMOS transistor 464 receives the output signal "ison" of the first input inverter 41, and a gate terminal of the ninth NMOS transistor 468 receives the output signal "isop" of the second input inverter 42. A node between the drain terminals of the seventh PMOS transistor 464 and the eighth NMOS transistor 468 provides an output signal of the second latch inverter 46. The first latch inverter 45 and the second latch inverter 46 substantially compose a latch to store the signals at the output terminal of the three-state gate 44, and provide the stored signal at the output terminal of the first latch inverter 45.

The three-state gate 44, the first latch inverter 45, and the second latch inverter 46 comprise a logic gate or a latch circuit to provide a propagated signal of the input signal "a" in response to the isolation control signal "iso". The input signal "a" is inverted by the three-state gate 44 before being provided to a latching loop of the first latch inverter 45 and the second latch inverter 46. The output of the first latch inverter 45 is provided to the second latch inverter 46, and the output of the second latch inverter 46 is provided to the first latch inverter 45, such that the first and second latch inverters 45, 46 latch the input signal "a". If the isolation control signal "iso" is logic "1", the output signal "ison" of the first input inverter 41 is logic "0", and the output signal "isop" of the second input inverter 42 is logic "1". Accordingly, the output signals "ison" and "isop" switch off the fourth PMOS transistor 444 and the sixth NMOS transistor 448 of the three-state gate 44. It should be understood that when the isolation control signal is logic "1", the first power domain is powered off, the switching off of the fourth PMOS transistor 444 and the sixth NMOS transistor 448 does not bring any leakage to the three-state gate 44. Further, the logic "0" output signal "ison" and the logic "1" output signal "isop" switch on the seventh PMOS transistor 464 and the eighth NMOS transistor 468 of the second latch inverter 46, which enables the held input signal to be provided to the output inverter 48.

The output inverter 48 is similar to the first latch inverter 45, and includes an eighth PMOS transistor 482 connected in series with a ninth NMOS transistor 484. The output inverter 48 is between the second power terminal Vdd_to to be coupled with the voltage supply of the second power domain, and ground (Vss). A node between drain terminals of the PMOS transistor 482 and the NMOS transistor 484 provides the output signal "x" of the isolation cell 40. The output signal "x" of the isolation cell 40 is a propagated signal of the input signal "a".

It can now be seen that the embodiments of the present invention provide an isolation cell to isolate and clamp a signal being passed from a first power domain to a second power domain. The isolation cell includes at least a logic circuit and an output circuit. One of the logic circuit and the output circuit is coupled to a voltage supply of one of the first and the second power domains, while the other of the logic circuit and the output circuit is coupled to a voltage supply of the other of the first and the second power domains. The logic circuit receives an input signal from the first power domain and an isolation control signal, which is indicative of a power-off state of the first power domain. For the one of the logic circuit and the output circuit coupled with the voltage supply of the first power domain, when the isolation signal is enabled, the voltage supply of the first power domain is cut-off so that leakage does not appear in this circuit. The isolation cell accordingly saves at least 50% of the leakage current when compared to the conventional isolation cell.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. An isolation cell connected between first and second circuit modules, wherein the first and second circuit modules comprise different power domains, the isolation cell comprising:
   an input terminal configured to receive an input signal from the first circuit module;
   an output terminal configured to provide an output signal to the second circuit module;
   a control terminal configured to receive a control signal, wherein the isolation cell generates the output signal from the input signal in response to the control signal;
   a first power terminal coupled with a first voltage supply of the first circuit module;
   a second power terminal coupled with a second voltage supply of the second circuit module;
   a first inverter having an input coupled to the control terminal for receiving the control signal, wherein the first inverter is coupled with the first power terminal and powered by the first voltage supply; and
   a second inverter having an output coupled to the output terminal for providing the output signal thereto, wherein the second inverter also is powered by the first voltage supply
   wherein the first inverter comprises:
   a first PMOS transistor having a gate terminal coupled with the control terminal for receiving the control signal, a source terminal coupled with the first power terminal, and a drain terminal;
   a first NMOS transistor having a gate terminal coupled with the control terminal, a drain terminal coupled with the drain terminal of the first PMOS transistor, and a source terminal; and
   a second NMOS transistor having a gate terminal coupled with the control terminal, a drain terminal coupled with the source terminal of the first NMOS transistor, and a source terminal connected to ground, wherein a node between the drain terminals of the first PMOS transistor and the first NMOS transistor provides an output of the first inverter; and
   wherein the second inverter comprises:
   a second PMOS transistor having a gate terminal coupled to receive an intermediate input signal, a source terminal coupled with the first power terminal, and a drain terminal; and
   a third NMOS transistor having a gate terminal coupled with the gate terminal of the second PMOS transistor, a drain terminal coupled with the drain terminal of the second PMOS transistor, and a source terminal connected to ground, wherein a node between the drain terminals of the second PMOS transistor and the third NMOS transistor is coupled to the output terminal.

2. The isolation cell of claim 1, further comprising a logic gate coupled with the input terminal and the second power terminal, wherein the logic gate comprises:
   a third PMOS transistor having a gate terminal coupled with the input terminal, a source terminal coupled with the second power terminal, and a drain terminal coupled with an input terminal of the second inverter;
   a fourth PMOS transistor having a gate terminal coupled with an output terminal of the first inverter, a source terminal coupled with the second power terminal, and a drain terminal coupled with the input terminal of the second inverter;
   a fourth NMOS transistor having a gate terminal coupled with the input terminal, a drain terminal coupled with the drain terminals of the third and fourth PMOS transistors, and a source terminal; and a fifth NMOS transistor having a gate terminal coupled with the output terminal of the first inverter, a drain terminal coupled with the source terminal of the fourth NMOS transistor, and a source terminal connected to ground.

3. The isolation cell of claim 1, further comprising:

a three-state gate having an input terminal for receiving the input signal, and two gating terminals respectively coupled with outputs of the first and second inverters, wherein the three-state gate is coupled with the first power terminal for receiving the first voltage supply of the first module;

a latch coupled with the second power terminal for receiving the second voltage supply of the second module, wherein the latch has an input terminal coupled with an output terminal of the three-state gate; and an output inverter coupled with the second power terminal, wherein the output inverter has an input terminal coupled with an output terminal of the latch, and an output terminal connected to the output terminal of the isolation cell for providing the output signal, wherein the isolation cell provides at the isolation cell output terminal, a propagated signal of the input signal in response to the control signal.

4. The isolation cell of claim 3, wherein the three-state gate comprises:

a third PMOS transistor having a gate terminal coupled with the input terminal, a source terminal coupled with the first power terminal, and a drain terminal;

a fourth PMOS transistor having a gate terminal coupled with the output terminal of the second inverter, a source terminal coupled with the drain terminal of the third PMOS transistor, and a drain terminal;

a fifth NMOS transistor having a gate terminal coupled with the input terminal, a source terminal connected to ground, and a drain terminal; and a sixth NMOS transistor having a gate terminal coupled with the output terminal of the first inverter, a source terminal coupled with the drain terminal of the fifth NMOS transistor, and a drain terminal coupled with the drain terminal of the fourth PMOS transistor, wherein a node between the drain terminals of the sixth NMOS transistor and the fourth PMOS transistor provides an output of the three-state gate.

5. The isolation cell of claim 4, wherein the latch comprises first and second latch inverters that are coupled with the second power terminal for receiving the second voltage supply of the second module, and wherein an input terminal of the first latch inverter is coupled with an output terminal of the second latch inverter, and an input terminal of the second latch inverter is coupled with an output terminal of the first latch terminal.

6. The isolation cell of claim 5, wherein the first latch inverter comprises:

a fifth PMOS transistor having a gate terminal coupled with an output terminal of the three-state gate, a source terminal coupled with the second power terminal, and a drain terminal; and a seventh NMOS transistor having a gate terminal coupled with the output terminal of the three-state gate, a drain terminal coupled with the drain terminal of the fifth PMOS transistor, and a source terminal connected to ground, wherein a node between the drain terminals of the fifth PMOS transistor and the seventh NMOS transistor provides an output of the first latch inverter.

7. The isolation cell of claim 6, wherein the second latch inverter comprises:

a sixth PMOS transistor having a gate terminal coupled with an output terminal of the first latch inverter, a source terminal coupled with the second power terminal, and a drain terminal;

a seventh PMOS transistor having a gate terminal coupled with an output terminal of the first input inverter, a source terminal coupled with the drain terminal of the sixth PMOS transistor, and a drain terminal;

an eighth NMOS transistor having a gate terminal coupled with the output terminal of the first latch inverter, a source terminal connected to ground, and a drain terminal; and a ninth NMOS transistor having a gate terminal coupled with an output terminal of the second input inverter, a source terminal coupled with the drain terminal of the eighth NMOS transistor, and a drain terminal coupled with the drain terminal of the seventh PMOS transistor, wherein a node between the drain terminals of the ninth NMOS transistor and the seventh PMOS transistor provides an input of the second latch inverter, and is connected to the output of the three-state gate.

8. The isolation cell of claim 7, wherein the output inverter comprises:

an eighth PMOS transistor having a gate terminal coupled with the output terminal of the first latch inverter, a source terminal coupled with the second power terminal, and a drain terminal; and a tenth NMOS transistor having a gate terminal coupled with the output terminal of the first latch inverter, a drain terminal coupled with the drain terminal of the eighth PMOS transistor, and a source terminal connected to ground, wherein a node between the drain terminals of the eighth PMOS transistor and the tenth NMOS transistor is coupled with the output terminal of the isolation cell.

9. A method of clamping an input signal going from a first power domain to a second power domain, wherein the first power domain operates at a first supply voltage and the second power domain operates at a second supply voltage different from the first supply voltage, the method comprising receiving, at an input terminal, the input signal from the first power domain;

receiving, at a control terminal, a control signal;

generating a logic signal, using at least one logic gate that receives the input signal and the control signal, in response to the control signal and the input signal;

providing the logic signal to an output inverter to generate an output signal, wherein the output inverter is coupled between the first supply voltage and ground; and configuring the at least one logic gate and the output inverter such that one of the at least one logic gate and the output inverter is coupled with the first supply voltage, and the other of the at least one logic gate and the output inverter is coupled with the second supply voltage; and providing a first input inverter that includes the control terminal as an input terminal for receiving the control signal, wherein the first input inverter is coupled to the first supply voltage, and wherein the first input inverter comprises a first PMOS transistor and first and second NMOS transistors, connected in series with each other between the first supply voltage and ground, and wherein the logic gate comprises one of:

a NAND gate coupled with the voltage supply of the second module and receiving the input signal and an inverted version of the control signal;

a NOR gate coupled with the voltage supply of the first module and receiving the input signal and the control signal; and a latch circuit coupled with the voltage supply of the first module.

10. The method of claim 9, further comprising:

coupling a three-state gate to the input terminal for receiving the input signal, wherein the three-state gate comprises third and fourth PMOS transistors, and fifth and sixth NMOS transistors, all connected in series between the first supply voltage and ground, and wherein gate terminals of the fourth PMOS transistor and the fifth NMOS transistor are respectively coupled with output terminals of the second inverter and the first inverter;

coupling a latch with an output of the three-state gate, wherein the latch is connected between the second supply voltage and ground; and coupling the output inverter to an output terminal of the latch, wherein the output terminal is connected between the second supply voltage and ground.

11. The method of claim 10, wherein coupling the latch with the output of the three-state gate comprises:

coupling a first latch inverter with an output of the three-state gate, wherein the first latch inverter comprises a fifth PMOS transistor connected in series between the second supply voltage and ground with a seventh NMOS transistor;

coupling a second latch inverter with an output of the first latch inverter, wherein the second latch inverter comprises a sixth PMOS transistor, a seventh PMOS transistor, an eighth NMOS transistor, and a ninth NMOS transistor, all connected in series, wherein gate terminals of the seventh PMOS transistor and the ninth NMOS transistor are respectively coupled with output terminals of the first inverter and the second inverter; and coupling an output terminal of the second latch inverter with an input terminal of the first latch inverter.

* * * * *